(12) United States Patent
Stahl et al.

(10) Patent No.: US 6,564,858 B1
(45) Date of Patent: May 20, 2003

(54) OVERHEAD COOLING SYSTEM WITH SELECTIVELY POSITIONED PATHS OF AIRFLOW

(75) Inventors: Lennart Stahl, Plano, TX (US); Christian Belady, McKinney, TX (US)

(73) Assignee: Liebert Corporation, Columbus, OH (US)

( * ) Notice: Subject to any disclaimer, the term of this patent is extended or adjusted under 35 U.S.C. 154(b) by 7 days.

(21) Appl. No.: 09/617,213

(22) Filed: Jul. 17, 2000

(51) Int. Cl.$^7$ ................................................ F28F 27/02
(52) U.S. Cl. .......................... 165/97; 165/122; 454/184
(58) Field of Search .............................. 165/75, 96, 97, 165/101, 122; 454/307, 184

(56) References Cited

U.S. PATENT DOCUMENTS

| | | | | |
|---|---|---|---|---|
| 2,377,094 A | * | 5/1945 | Meyerhoefer | 165/97 |
| 3,292,688 A | * | 12/1966 | Shrader | 165/97 |
| 3,477,502 A | * | 11/1969 | Katz | 165/97 |
| 4,373,576 A | * | 2/1983 | Strupczewski | 165/97 |
| 5,050,667 A | * | 9/1991 | Berner et al. | 165/97 |
| 5,135,046 A | * | 8/1992 | Becquerel et al. | 165/122 |
| 5,230,719 A | * | 7/1993 | Berner et al. | 165/97 |
| 5,232,403 A | * | 8/1993 | Marotta | 454/307 |
| 5,538,074 A | * | 7/1996 | Meyer | 165/122 |
| 5,697,841 A | * | 12/1997 | Di Giovine | 454/307 |

FOREIGN PATENT DOCUMENTS

| | | | | |
|---|---|---|---|---|
| JP | | 4-143527 A | * 5/1992 | 165/122 |

* cited by examiner

Primary Examiner—Henry Bennett
Assistant Examiner—Terrell McKinnon
(74) Attorney, Agent, or Firm—Howrey Simon Arnold & White, LLP (57) ABSTRACT

A method and system are disclosed for cooling a heat generating object. A coolant is passed through a heat exchanger so that heated air passing through the heat exchanger is cooled. A fan unit is selectively positioned adjacent to a first side of the heat exchanger. When activated, the fan unit draws the cooled air through the heat exchanger and directs the cooled air towards the heat generating object. The fan unit may be repositioned along a second side of the heat exchanger so as to redefine the flow of air drawn from and directed towards the heat generating object.

41 Claims, 8 Drawing Sheets

OVERHEAD COOLING SYSTEM WITH SELECTIVELY POSITIONED PATHS OF AIRFLOW

CROSS REFERENCE TO RELATED APPLICATIONS

This application is related to U.S. applications for patent, Ser. No. 09/617,391, filed Jul. 17, 2000, entitled "Reconfigurable System and Method for Cooling Heat Generating Objects".

BACKGROUND OF THE INVENTION

1. Technical Field of the Invention

The present invention relates to cooling systems for cooling electronic equipment, and particularly to systems for cooling electronic equipment that are reconfigurable to allow customized air flow in proximity to the electronic equipment.

2. Background and Objects of the Invention

The growth of the computer industry and telephony over the past few decades has been phenomenal. The integration of these technologies has lead to greater and greater efficiencies as larger numbers of communications are handled by fewer components, which are typically housed in a central control room.

One problem inherent with many existing cooling systems for electronic equipment is rigidity. Many existing cooling systems are built into and/or under the flooring of a temperature-controlled room having equipment needing to be cooled. Such cooling systems oftentimes employ fixed conduits or other piping for directing cooled air along a subsurface of the flooring and upwardly through the floor and towards the equipment to be cooled. The upwardly directed cooled air is in proximity to the equipment. In the event the temperature characteristics within the temperature-cooled room changes, such as by the equipment being moved within the room or by additional equipment being added therein, it is very difficult to modify the cooling system accordingly. For instance, the conduits have to be detached from their fixed positions and repositioned, or replaced in favor of differently sized conduits. Consequently, altering the cooling characteristics of existing cooling systems frequently proves a costly adventure.

Floor-based cooling systems present additional difficulties other than rigidity in its cooling characteristics. For instance, floor-based cooling systems that do not utilize conduits for passing cooled air occupy more area so that equipment cabling and other obstructions do not cause uneven air distribution or a reduction in air pressure. Such systems require the equipment cabling to be plenum rated, thereby increasing system cost. Floor-based cooling systems also possess the tendency to distribute noise and vibrations, which may effect the operation of the equipment to be cooled.

In addition, floor-based and other existing cooling systems have a rather limited cooling capability. For instance, existing cooling systems have heat densities of approximately 80 watts per square foot (w/ft$^2$) with planned cooling systems being claimed to possess heat densities of up to 150 w/ft$^2$. Cooling systems having such heat densities, however, may not effectively cool today's equipment, such as state-of-the-art computational equipment.

As is readily apparent, if equipment is not effectively cooled, the internal temperature of the components in the electronic equipment substantially increases, thereby leading to significantly reduced system performance and, in some cases, total system failure. If a cooling system inefficiently cools the equipment, either the equipment may fail due to increased operating temperature or the costs for cooling the equipment may be unnecessarily high. What is needed, then, is a cooling system having its cooling characteristics closely tailored to the heating characteristics of the equipment to be cooled.

SUMMARY OF THE INVENTION

The present invention overcomes the above-discussed shortcomings and satisfies a significant need for a cooling system for cooling a heat generating object. In accordance with an embodiment of the present invention, a cooling system includes a frame and a heat exchanger, such as a cooling coil, connected thereto so that airflow is capable of passing through the frame in proximity to the heat exchanger. A fan unit is adjustably positioned along either one of a first side and a second side of the heat exchanger so that air is drawn through the heat exchanger in a first direction and a second direction, respectively. Air drawn through the heat exchanger is directed towards the heat generating object.

The operation of the embodiment of the present invention includes passing coolant within the heat exchanger. The fan unit is positioned along the first side of the heat exchanger and activated so as to draw air through the heat exchanger in the first direction. The drawn air is heated air collected from a heat generating object to be cooled. The frame directs the drawn air towards the heat generating object. In the event the temperature characteristics of the heat generating object are changed, the fan unit may be repositioned along the second side of the heat exchanger. The activated fan unit thereupon draws air through the heat exchanger in a second direction that is opposite the first direction. The drawn air is directed towards the heat generating object accordingly.

BRIEF DESCRIPTION OF THE DRAWINGS

A more complete understanding of the system and method of the present invention may be obtained by reference to the following Detailed Description when taken in conjunction with the accompanying Drawings wherein.

DETAILED DESCRIPTION OF THE PREFERRED EXEMPLARY EMBODIMENTS

The present invention will now be described more fully hereinafter with reference to the accompanying drawings in which a preferred embodiment of the invention is shown. This invention may, however, be embodied in many different forms and should not be construed as being limited to the embodiment set forth herein. Rather, the embodiment is provided so that this disclosure will be thorough and complete, and will fully convey the invention to those skilled in the art.

Figure 1:
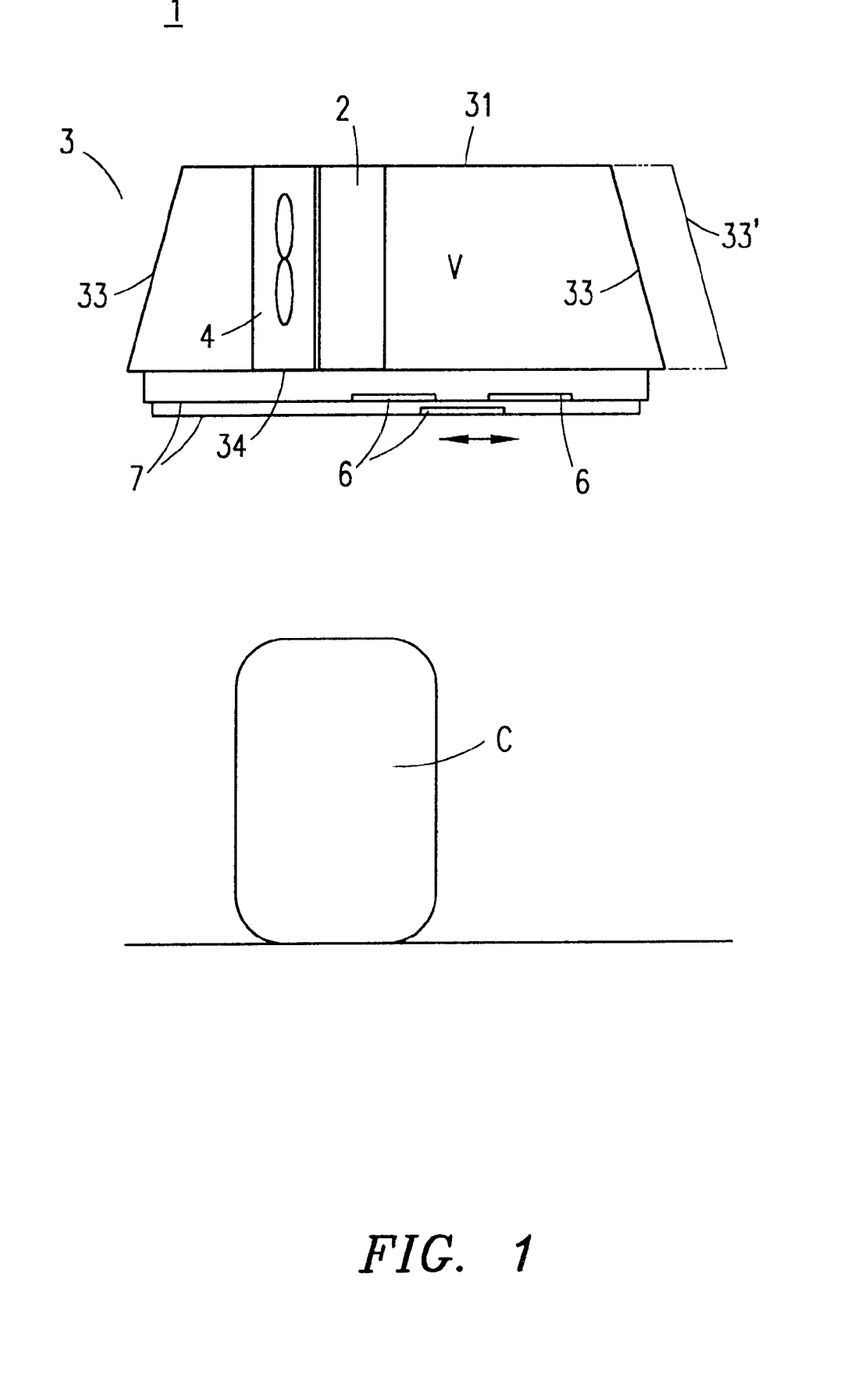
FIG. 1 is a side elevational view of a cooling system in association with heat generating equipment, in accordance with an embodiment of the present invention.

Referring to FIGS. 1–6, there is shown a cooling, system 1 according to an embodiment of the present invention. Cooling system 1 is adapted to provide cooled air to one or more heat generating object(s) C, such as a computer equipment. As shown in FIG. 1, cooling system 1 may be disposed above the heat generating object(s) C that cooling system 1 is intended to cool. As such, cooling system 1 may be attached along or suspended from a ceiling of the room in which the heat generating object C is located. Cooling system 1 includes at least one heat exchanger 2 in which a coolant fluid is passed. Heat exchanger 2 may be a cooling coil or other comparable device. Air is cooled by being directed in proximity to heat exchanger 2. According to the embodiment of the present invention shown in FIG. 1, heat exchanger 2 is dimensioned so that a sizeable amount of air is capable of passing in a transverse (horizontal) direction through or in proximity to heat exchanger 2 and cooled thereby. Coolant temperature and flow rate within heat exchanger 2 may be controlled manually or automatically.

Cooling system 1 further includes a frame 3 to which heat exchanger 2 is attached. Frame 3 is utilized for connecting together various components of cooling system 1, as explained below. Cooling system 1 may be attached to or suspended from a ceiling or other object by connecting frame 3 thereto. Frame 3 includes a top member 31, a pair of side members 32, a pair of end members 33 and a bottom member 34 that combine to define a volume V in which heated air is drawn from heat generating object C and from which cooled air is directed towards heat generating object C. Heat exchanger 2 is attached within frame 3 so that heat exchanger 2 is disposed substantially laterally therein such that heat exchanger 2 extends between top member 31 and bottom 34 as well as between side members 32. In the exemplary embodiment of the present invention shown in FIG. 1, heat exchanger 2 is positioned relatively slightly off center within frame 3. It is understood, however, that heat exchanger 2 may be centrally disposed within frame 3.

Cooling system 1 includes at least one fan unit 4 that is selectively connected to frame 3 adjacent a side of heat exchanger 2. Fan unit 4 blows air away from heat exchanger 2 when activated so that air is drawn in proximity to heat exchanger 2. Fan unit 4 may include one or more fans 41. Although fan unit 4 is shown as including four fans 41 (FIG. 2), it is understood that the number of fans 41 in fan unit 4 may vary depending upon the operating requirements of cooling system 1. When activated, fans 41 run at a predetermined speed. It is understood, however, that the speed of fans 41 may be selectively varied during the cooling operation, either manually or automatically.

Figure 2:
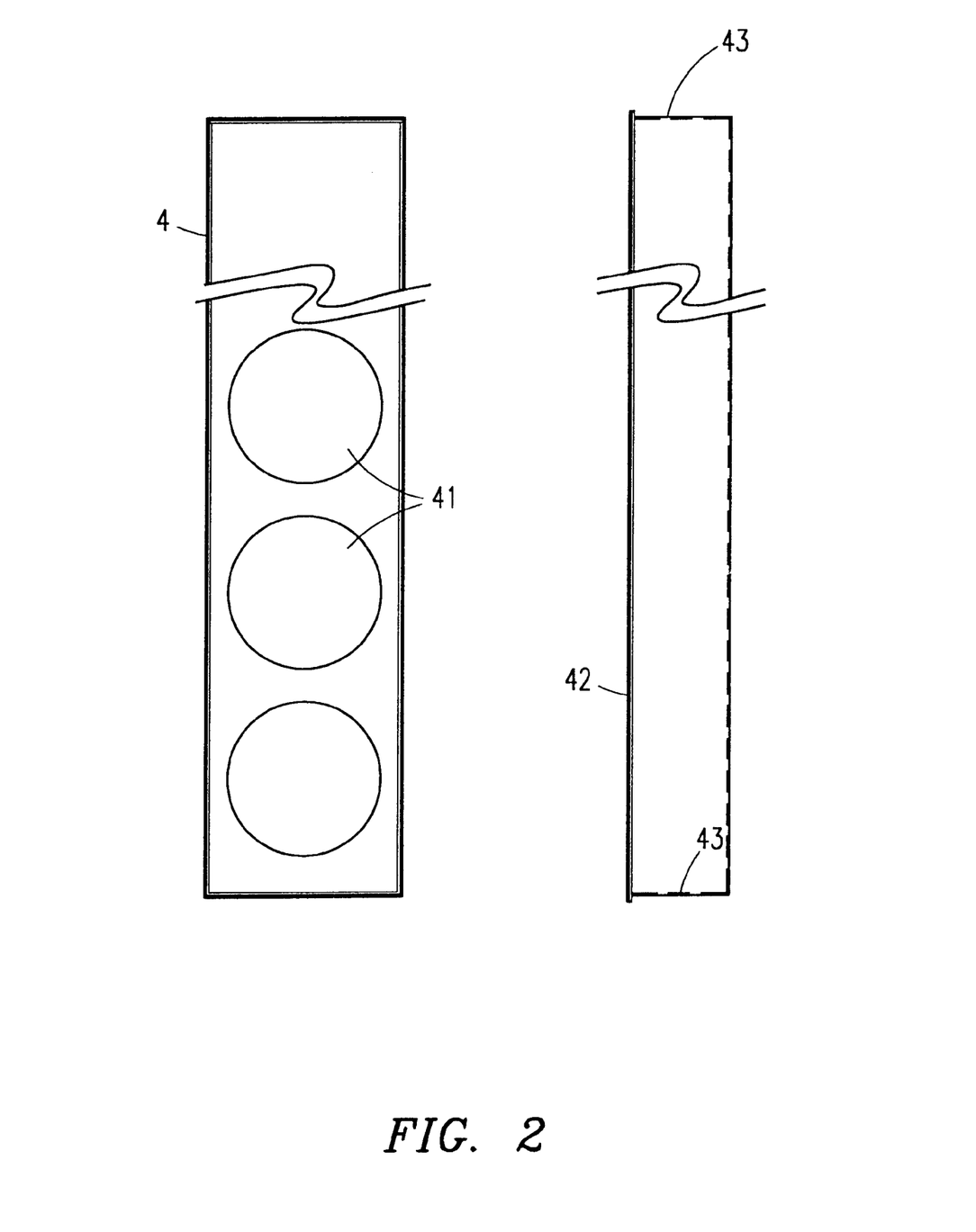
FIG. 2 is a diagram showing the front and side elevational views of the fan unit of the cooling system shown in FIG. 1.
Figure 3:
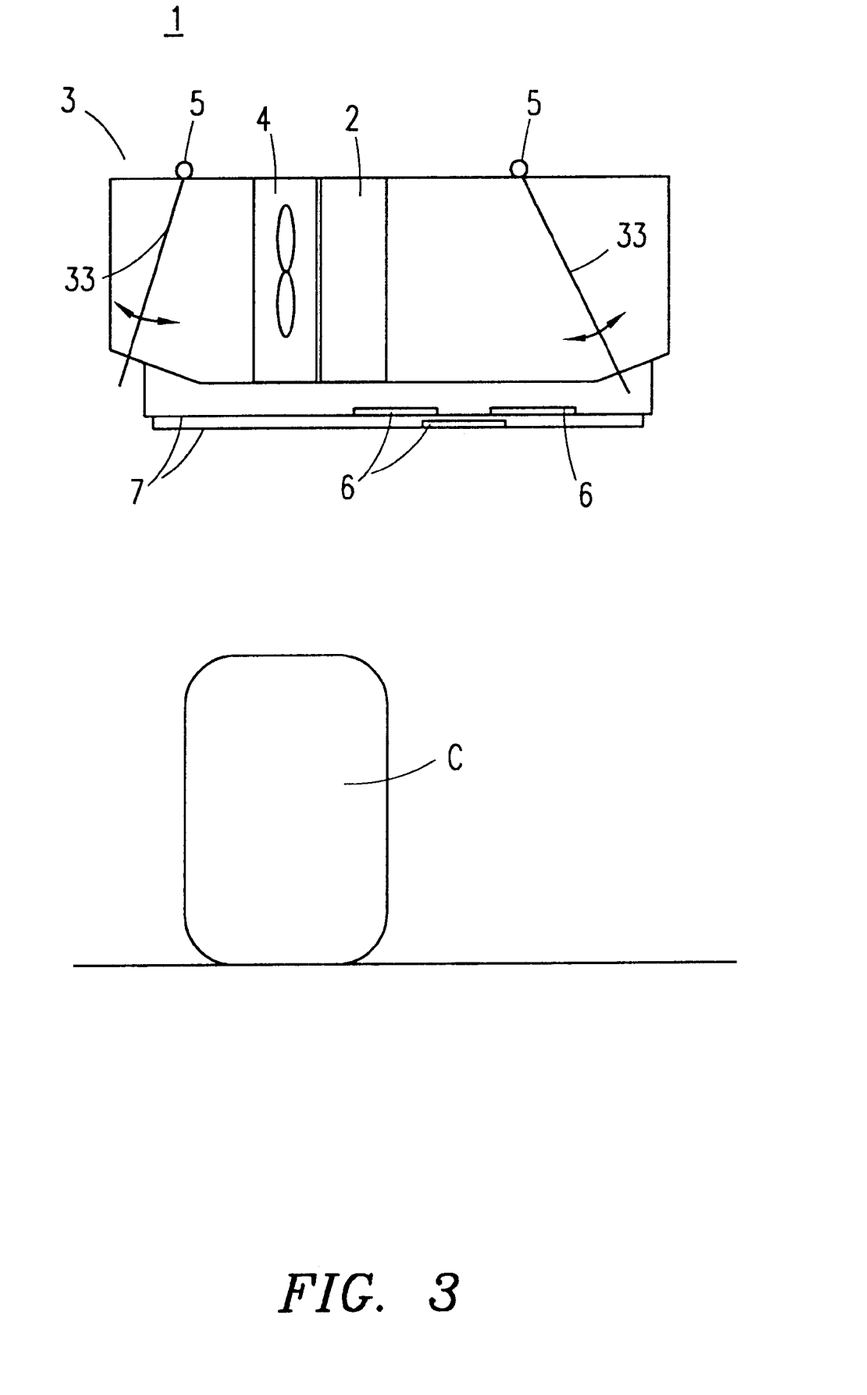
FIG. 3 is a side elevational view of a cooling system in association with heat generating equipment, in accordance with another embodiment of the present invention.
Figure 4:
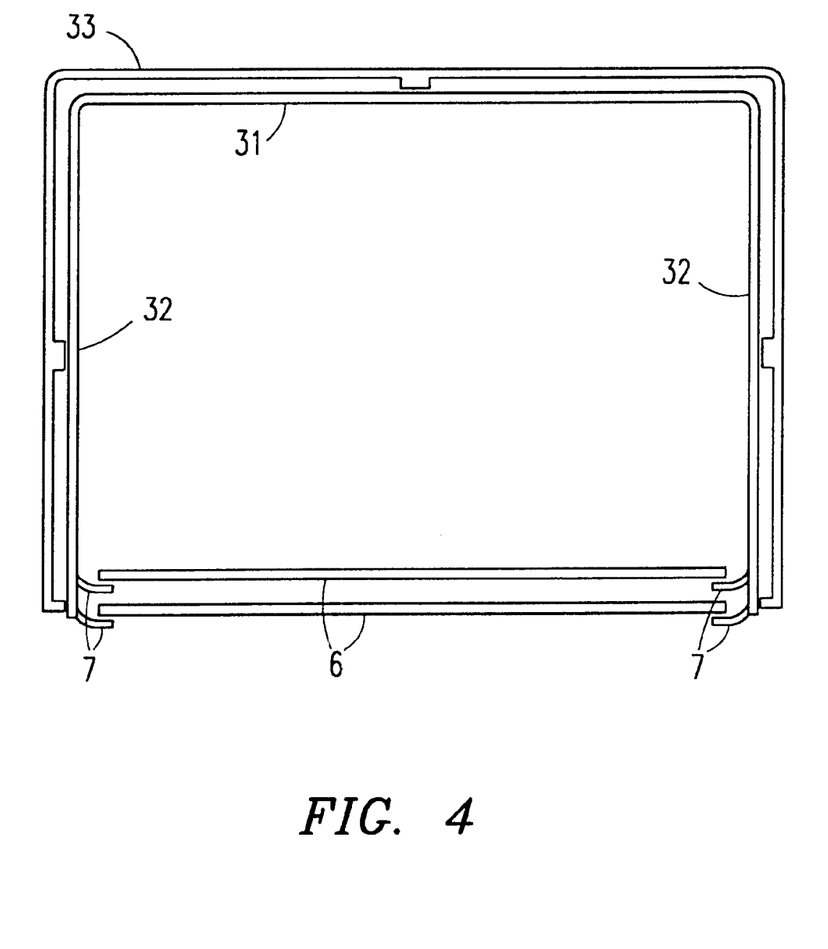
FIG. 4 is an end view of the cooling system shown in FIG. 1.

Fan unit 4 further includes a pair of side members 42 and a pair of end members 43. Side members 42 and end members 43 are dimensioned for stably supporting fan unit 4 in a substantially vertical and/or lateral position within frame 3.

Because the thermal characteristics of heat generating object C may vary, such as by moving heat generating object C relative to cooling system 1, or adding equipment to or removing equipment from heat generating object C, it is advantageous to modify the cooling and/or operating characteristics of cooling system 1 accordingly. According to an embodiment of the present invention, fan unit 4 may be selectively repositioned within frame 3. In particular, fan unit 4 may be positioned along either side of heat exchanger 2. This selective repositioning allows airflow passing through heat exchanger 2 to be defined in either of two directions, as explained in greater detail below.

Accordingly, fan unit 4 is selectively attached to frame 3 using one of a number of removable attachment mechanisms. For instance, fan unit 4 may be attached to frame 3 (top member 31, bottom member 34 and/or side members 32) using nuts and bolts, screws, clamp mechanisms or the like. Alternatively, side members 42 and end members 43 of fan unit 4 are sized such that fan unit 4 stably rests on bottom member 34 of frame 3 without any securement thereto.

End members 33 of frame 3 facilitate the flow of heated air from heat generating object C towards heat exchanger 2, and the flow of cooled air from heat exchanger 2 towards heat generating object C. In one embodiment of the present invention shown in FIG. 1, end members 33 are angled so that a cross section of frame 3 has a substantially trapezoidal shape. In a second embodiment of the present invention shown in FIG. 3, at least one end member 33 is pivotably attached to top member 31. In this second embodiment, end member 33 is attached to top member 31 by one or more hinge members 5. End member 33 may be secured in a fixed position relative to side members 32 and top member 31 so that an angle defined between top member 31 and end member 33 is selectively varied. The angled end members 33 aid in directing paths of air flow both to and from heat generating object C.

Frame 3 may be adjustable so that a length thereof may be varied to substantially closely match the size of heat generating object C. According to the first embodiment of the present invention, cooling system 1 includes a plurality of end members 33 having various lengths. FIG. 1 illustrates an additional end member 33' shown in dashed lines attached to side members 32. In this way, the side members 33 having the desired length may be attached to top member 31 and side members 32 so that the overall length of frame 3 substantially closely matches the size of heat generating object C. In a third embodiment of the present invention shown in FIG. 4, end members 33 telescopically engage with top member 31 and side members 32 so that a length of frame 3 may be slidingly adjusted as desired.

Figure 5:
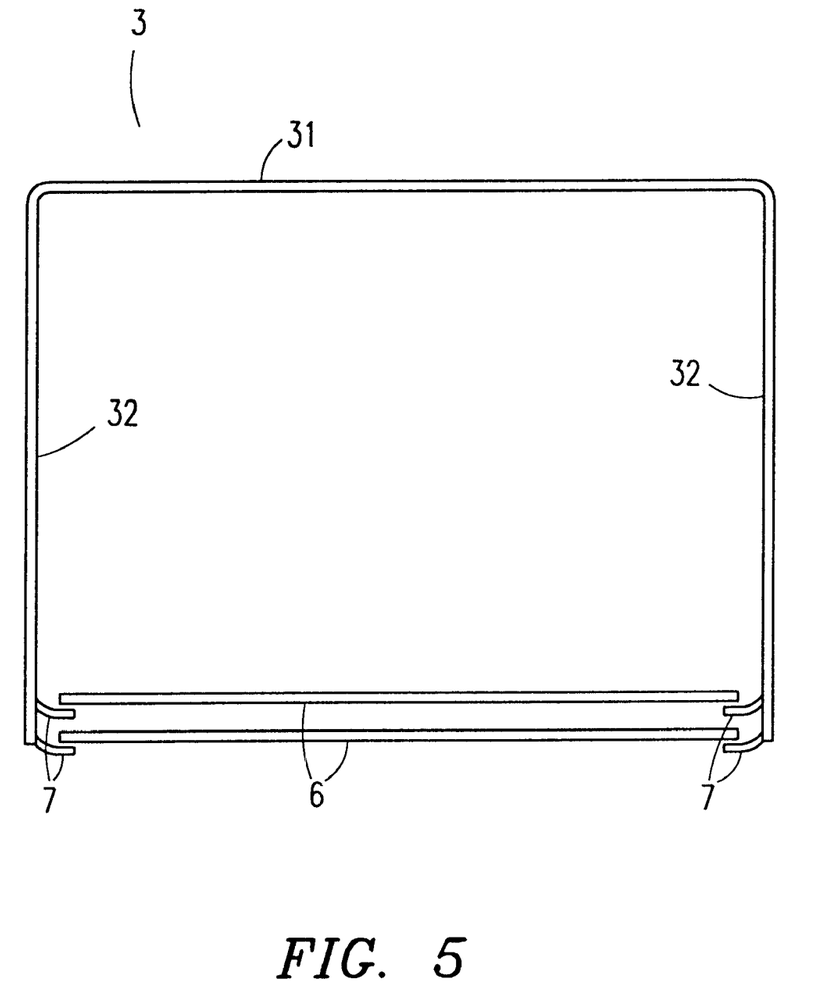
FIG. 5 is an end view of the cooling system in accordance with another embodiment of the present invention.

As stated above, frame 3 and particularly end members 33 direct paths of airflow to and from heat generating object C. Frame 3 further includes one or more panel members 6 that are positioned along a bottom surface of frame 3 and further define the paths of airflow that draw heated air in and discharge cooled air from frame 3, respectively. Specifically, panel members 6 may be positioned along either or both sides of heat exchanger 2. Panel members 6 may slidingly engage with side members 32 of frame 3. As shown in FIG. 5, side members 32 include a tray assembly 7 having one or more shelves with which panels 6 are positioned. Alternatively, panel members 6 may removably attach to side members 32 using any of a number of connecting mechanisms, such as nuts and bolts, screws, clamp mechanisms or the like.

Figure 8:
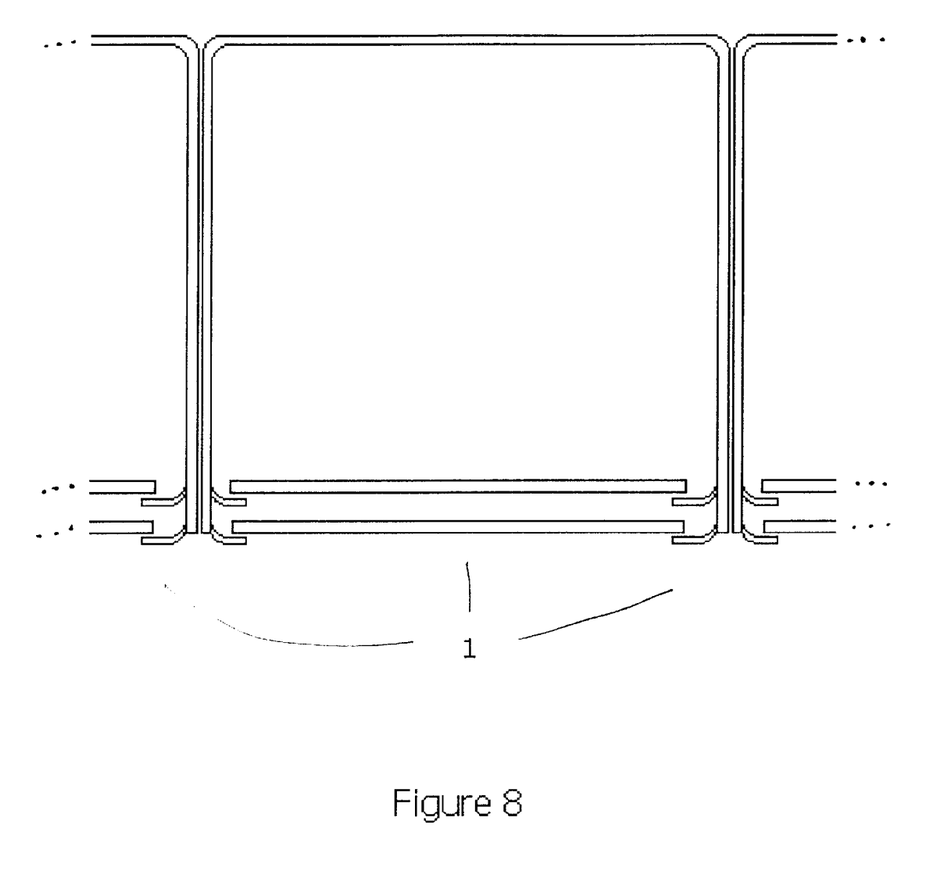
FIG. 8 is an end view of the cooling system shown in FIG. 1.

Cooling system 1 may be modular so that a plurality of cooling systems 1 may be positioned adjacent each other along a ceiling and/or above one or more heat generating objects C. In particular, each side member 32 may be shaped to engage with and/or securely attach to a like side member 32 of the frame member 3 of another cooling system 1. As shown in FIG. 8, frame member 3 may be shaped so that multiple cooling systems 1 may be positioned substantially flush against each other. In this way, an array or matrix of cooling systems 1 may effective cool an enlarged room having heat generating equipment C.

Figure 6:
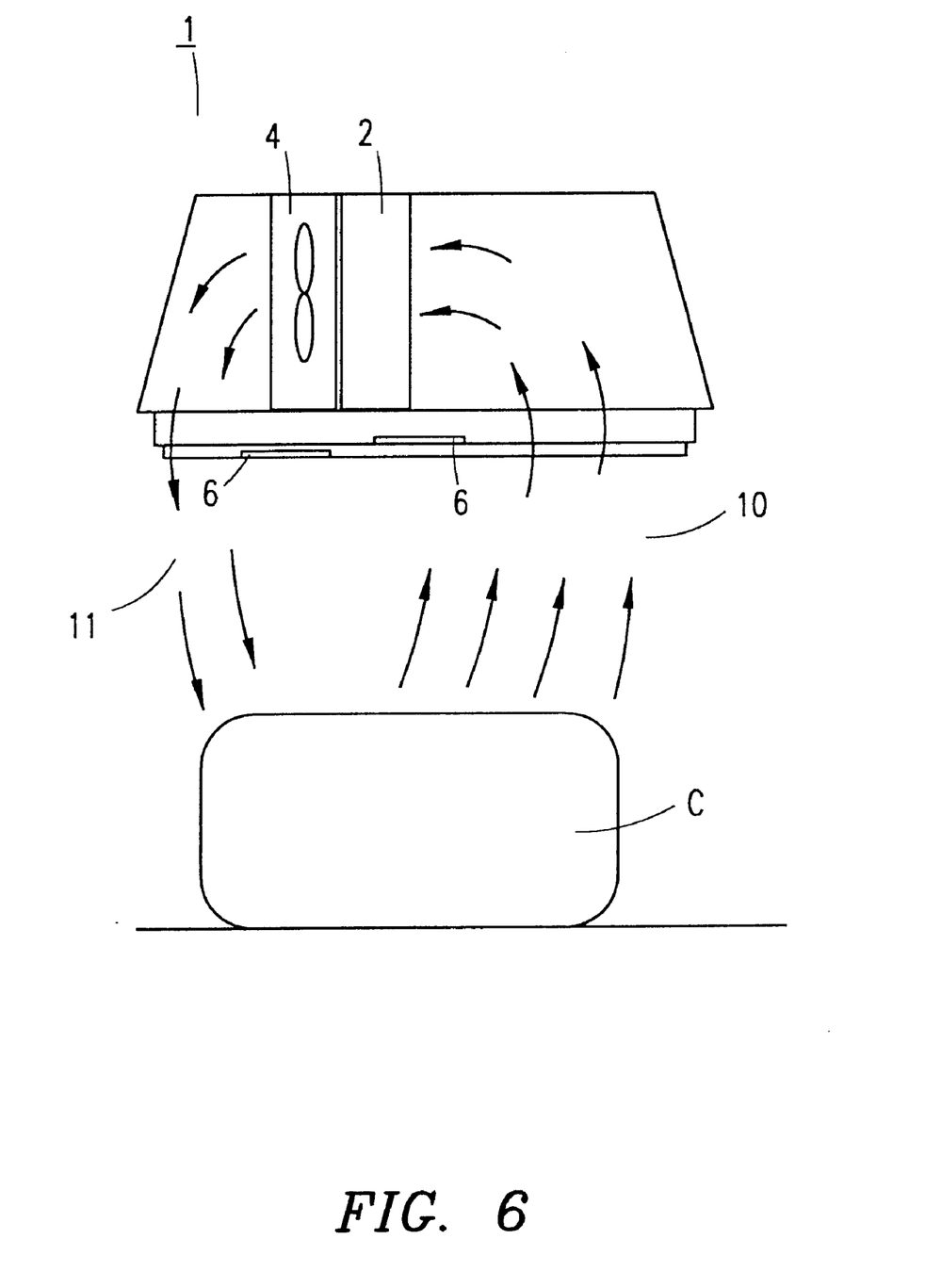
FIGS. 6 and 7 are side elevational views of a cooling system in association with heat generating equipment, illustrating an operation of the embodiment of the present invention shown in FIG. 1.
Figure 7:
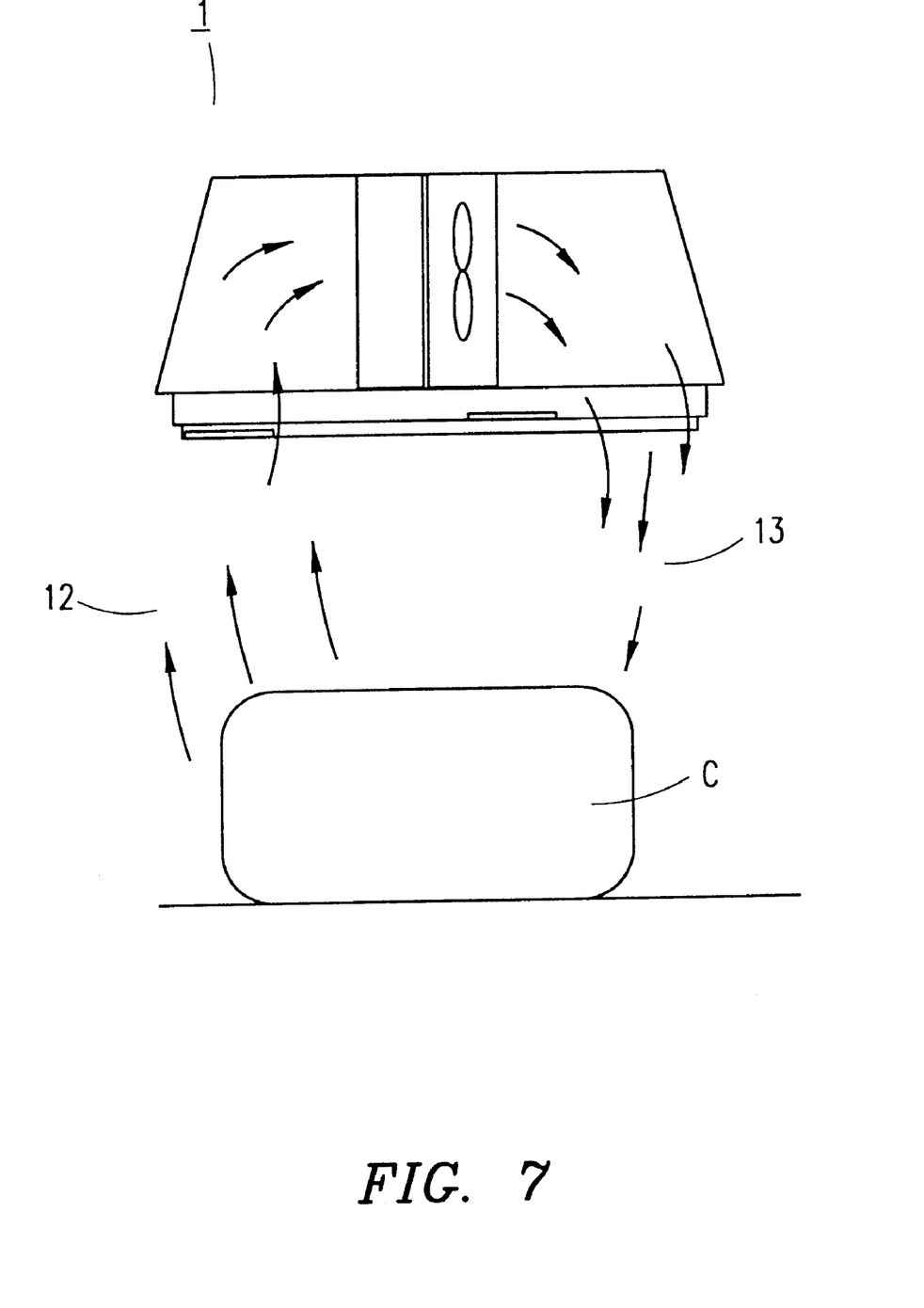

The operation of cooling system 1 will be described with reference to FIGS. 6 and 7. Initially, fan unit 4 is positioned within frame member 3 adjacent a side of heat exchanger 2 and (optionally) secured to frame 3. Panel members 6 are positioned along side members 32 as desired. Coolant is forced to flow within heat exchanger 2. Next, heated air from heat generating object C is drawn therefrom along one or more first paths of airflow 10 (FIG. 6). The heated air naturally rises from heat generating object C and is collected within frame 3. The collected air within frame 3 is then drawn through heat exchanger 2 by activated fan unit 4 and blown away therefrom. Fan unit 4 also facilitates the flow of heated air from heat generating object C along the first path(s) 10 of airflow. The air is cooled as the air is passed through heat exchanger 2. The blown air flows around panel members 6 and is directed by end member 33 towards heat generating object C along one or more second paths 11 of airflow. In this way, fan unit 4, end members 33 and panel members 6 define paths 10 and 11 of airflow that effectuate the recirculation of cooled air relative to heat generating objects C.

In the event it is desired to change the location of the first path(s) 10 of airflow and second path(s) 11 of airflow, such as due to a change in the thermal operating characteristics of heat generating object C, cooling system 1 may be reconfigured accordingly. In particular, fan unit 4 may be disconnected from frame assembly 3 and repositioned along the other side of heat exchanger 2, as shown in FIG. 7. Side panels 6 may be repositioned along side members 32 accordingly. At least one end member 33 may be adjusted as desired, relative to top member 31 of frame 3. Once fan unit 4 is repositioned and activated, air heated by heat generating object C is drawn and collected into frame 3 along a third path 12 of airflow. The collected air is then drawn by repositioned fan unit 4, passes through heat exchanger 2 and blown from fan unit 4. The blown air, having been cooled by passing normal and in proximity to heat exchanger 2, is directed towards heat generating objects C along a fourth path 13 of airflow defined by end member 33 and repositioned panel members 6. As a result, the paths of circulated airflow are selectively redefined by reconfiguring cooling system 1 as desired.

One advantage provided by the cooling systems according to the present invention concerns heat density. The cooling systems of the present invention are capable of possessing a heat density of approximately 200 w/ft$^2$ or more. Relative to existing cooling systems, the cooling systems of the present invention are more capable of meeting the cooling demands of tomorrow's heat generating equipment.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A cooling system, comprising:
    a frame, having an adjustable size so that a volume defined thereby is selectively varied;
    a heat exchanger unit in which coolant fluid is passed connected to said frame such that air flow is capable of passing through said frame in proximity to said heat exchanger unit;
    a fan unit connected to said frame and selectively positioned within said frame along either side of said heat exchanger unit such that airflow into and out of said frame may be selectively varied; and
    a plurality of panel members selectively positioned along an underside of said frame so as to cooperate with said fan unit to define airflow paths into and out of said frame.

2. The cooling system of claim 1, wherein:
    said fan unit is removably attached to said frame.

3. The cooling system of claim 1, wherein:
    said frame includes a top member, side members and end members so as to define a volume therebetween.

4. The cooling system of claim 3, wherein:
    said end members are removably attached to said side members.

5. The cooling system of claim 4, further comprising:
    a plurality of end members having different lengths.

6. The cooling system of claimed 1, wherein:
    a size of said frame member is adjustable so that a volume defined thereby is selectively varied.

7. The cooling system at claim 1, wherein:
    said fan unit is selectively positioned adjacent said heat exchanger unit and operates to blow air away therefrom.

8. The cooling system of claim 1, wherein:
    said fan unit comprises a plurality of fan members.

9. The cooling system of claim 1, wherein:
    said frame includes side members, each side member includes at least one track with which said panel members slidingly engage.

10. The cooling system of claim 1, wherein:
    said frame includes a top member, side members end members pivotably attached to said top member.

11. The cooling system of claim 10, and wherein:
    an angle between at least one of said end members said top member is adjustable.

12. The cooling system of claim 1, wherein:
    said fan unit is selectively laterally positioned within said frame.

13. The cooling system of claim 3, wherein:
    said heat exchanger is positioned off-center within said frame.

14. The cooling system of claim 1, wherein:
    said heat exchanger unit is positioned laterally within said frame.

15. An apparatus for cooling a heat generating object, comprising;
    a heat exchanger in which coolant fluid is passed;
    a fan unit selectively positioned along any of a first side and a second side of said heat exchanger so that air is drawn through said heat exchanger in one of a first direction and a second direction, respectively; and
    a frame comprising a top member, a pair of side members and a pair of end members, said heat exchanger being attached within said frame member and said fan unit being disposed within said frame member adjacent said heat exchanger;
    wherein a length of said frame is selectively adjustable.

16. The apparatus of claim 15, wherein:
    said heat exchanger is attached to said top member so as to extend therefrom.

17. The apparatus of claim 15, wherein:
said fan unit and said heat exchanger are substantially laterally disposed within said frame so that air passing through said heat exchanger in said first and said second directions flows substantially longitudinally relative to said frame.

18. The apparatus of claim 15, wherein:
at least one of said end members is removably attached to said side members.

19. The apparatus of claim 15, wherein:
said frame includes at least one hinge connecting at least one of said end members to said top member.

20. The apparatus of claim 19, wherein:
an angle defined between said at least one end member and said top member is adjustable.

21. The apparatus of claim 15, further comprising:
at least one panel member connected to said side members, said at least one panel member being adjustably positioned along said side members.

22. The apparatus of claim 21, wherein:
said side members include a track assembly on which said at least one panel member is slidingly engaged.

23. The apparatus of claim 15, wherein:
said frame member is shaped so that said apparatus is positionable substantially flush against another of said apparatus.

24. A cooling system, comprising:
a frame, having an adjustable size so that a volume defined thereby is selectively varied;
a heat exchanger unit in which coolant fluid is passed connected to said frame such that air flow is capable of passing through said frame in proximity to said heat exchanger unit;
a fan unit connected to said frame and selectively positioned within said frame along either side of said heat exchanger unit such that airflow into and out of said frame may be selectively varied.

25. The cooling system of claim 24, wherein:
said fan unit is removably attached to said frame.

26. The cooling system of claim 24, wherein:
said frame includes a top member, side members and end members so as to define a volume therebetween.

27. The cooling system of claim 26, wherein:
said end members are removably attached to said side members.

28. The cooling system of claim 27, further comprising:
a plurality of end members having different lengths.

29. The cooling system of claim 24, wherein:
said fan unit is selectively positioned adjacent said heat exchanger unit and operates to blow air away therefrom.

30. The cooling system of claim 24, wherein:
said fan unit comprises a plurality of fan members.

31. The cooling system of claim 24, further comprising:
a plurality of panel members selectively positioned along an underside of said frame so as to cooperate with said fan unit to define airflow paths into and out of said frame.

32. The cooling system of claim 31, wherein:
said frame includes side members, each side member includes at least one track with which said panel members slidingly engage.

33. The cooling system of claim 24, wherein:
said frame includes a top member, side members and end members pivotably attached to said top member.

34. The cooling system of claim 33, wherein:
an angle between at least one of said end members and said top member is adjustable.

35. The cooling system of claim 24, wherein:
said fan unit is selectively laterally positioned within said frame.

36. The cooling system of claim 35, wherein:
said heat exchanger is positioned off-center within said frame.

37. The cooling system of claim 24, wherein:
said heat exchanger unit is positioned laterally within said frame.

38. A method of cooling a heat generating object, comprising the steps of:
passing coolant within a heat exchanger;
drawing air in proximity to said heat exchanger in a first direction;
directing air drawn in proximity to said heat exchanger in said first direction towards said heat generating object;
following said step of drawing air in a first direction, drawing air in proximity to said heat exchanger in a second direction substantially opposite said first direction; and
directing air drawn in proximity said heat exchanger in said second direction towards said heat generating object.

39. The method of claim 38, wherein each of said steps of drawing air in said first and said second direction comprises the step of:
blowing air away from said heat exchanger.

40. The method of claim 39, wherein said step of blowing air comprises the step of:
operating a fan unit to blow air away from said heat exchanger unit.

41. The method of claim 38, wherein said step of directing air drawn in proximity to said heat exchanger in said first direction comprises the step of:
blocking air from flowing through an area between said heat exchanger and said heat generating object so that air directed towards said heat generating object does not flow through said area.

* * * * *